(12) United States Patent
Akahoshi et al.

(10) Patent No.: US 8,294,481 B2
(45) Date of Patent: Oct. 23, 2012

(54) HANDLER

(75) Inventors: Susumu Akahoshi, Tokyo (JP); Michio Kato, Tokyo (JP)

(73) Assignee: Tesec Corporation, Tokyo (JP)

(*) Notice: Subject to any disclaimer, the term of this patent is extended or adjusted under 35 U.S.C. 154(b) by 359 days.

(21) Appl. No.: 12/724,359

(22) Filed: Mar. 15, 2010

(65) Prior Publication Data

US 2010/0230908 A1    Sep. 16, 2010

(30) Foreign Application Priority Data

Mar. 16, 2009 (JP) ................................. 2009-063026

(51) Int. Cl.
*B65D 85/86* (2006.01)
(52) U.S. Cl. ......... 324/755.01; 324/756.01; 324/756.07; 324/757.01
(58) Field of Classification Search .................. 414/758; 324/755.01, 756.01, 756.07, 757.01
See application file for complete search history.

(56) References Cited

U.S. PATENT DOCUMENTS

| | | | |
|---|---|---|---|
| 5,757,200 A * | 5/1998 | Yamashita | 324/750.25 |
| 6,246,245 B1 * | 6/2001 | Akram et al. | 324/756.03 |
| 6,741,090 B2 * | 5/2004 | Yamashita | 324/750.08 |

FOREIGN PATENT DOCUMENTS

JP    2007-309787 A    11/2007

* cited by examiner

*Primary Examiner* — James Keenan
(74) *Attorney, Agent, or Firm* — Blakely, Sokoloff, Taylor & Zafman

(57) ABSTRACT

A handler includes a table which supports an electronic device, a socket which is arranged to face the table, and a transport mechanism which transports the electronic device. The transport mechanism includes a contact head having a lead press with a recess for storing the electronic device, and a chuck sleeve which extends through the lead press, is arranged relatively movable from the lead press in a direction in which the chuck sleeve extends, and chucks the electronic device, an elevating mechanism which moves the contact head between the table and the socket, a pivot mechanism which pivots the contact head within the vertical plane, and a control unit which controls chucking and release of the electronic device by the chuck sleeve, and vertical movement and pivot of the contact head.

4 Claims, 10 Drawing Sheets

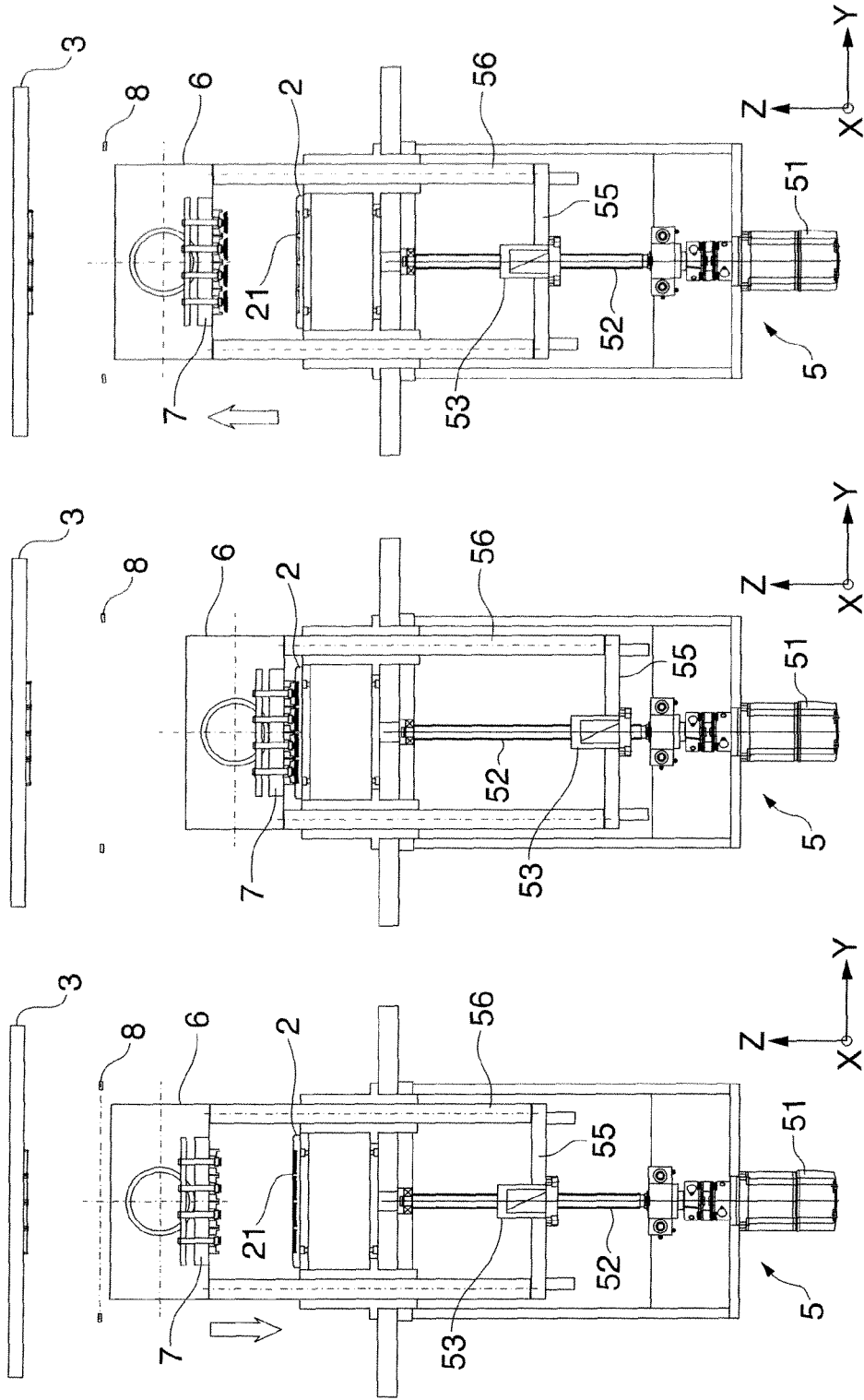

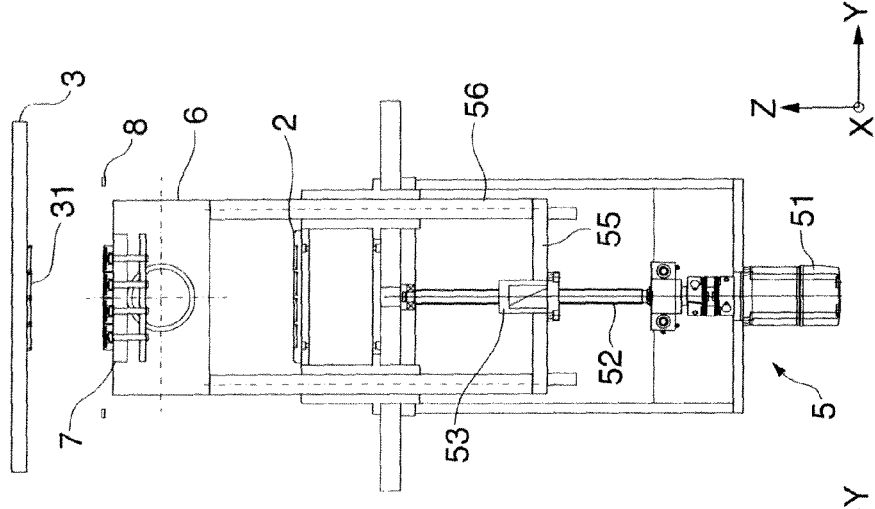
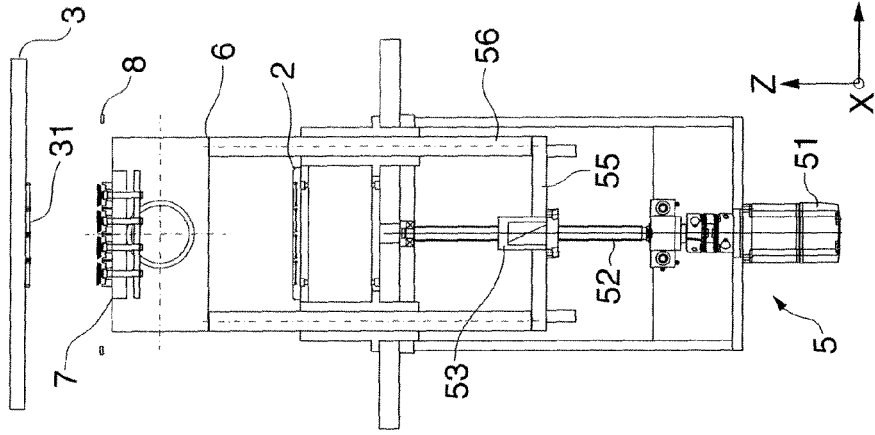
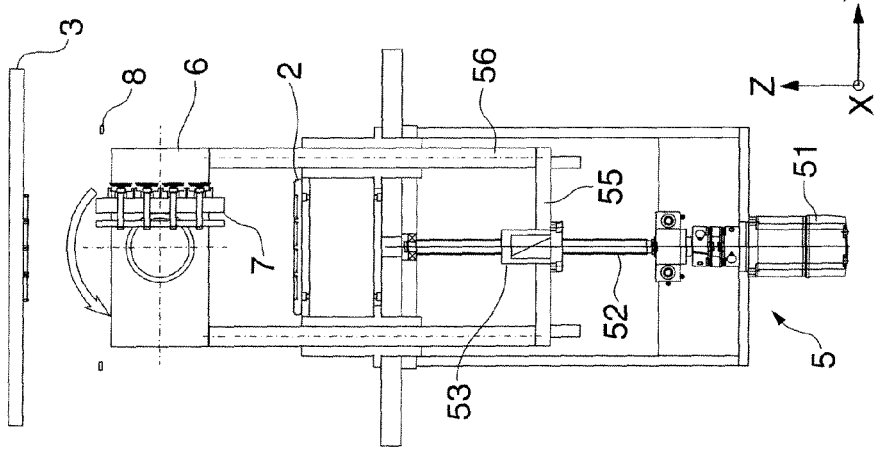

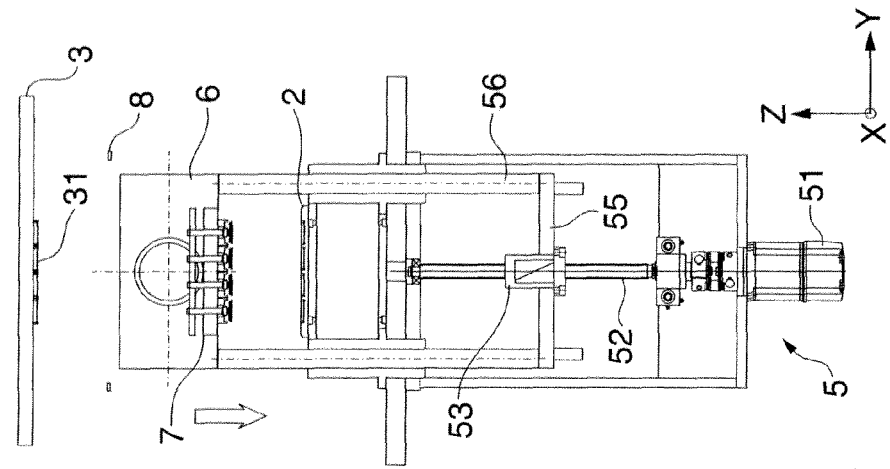
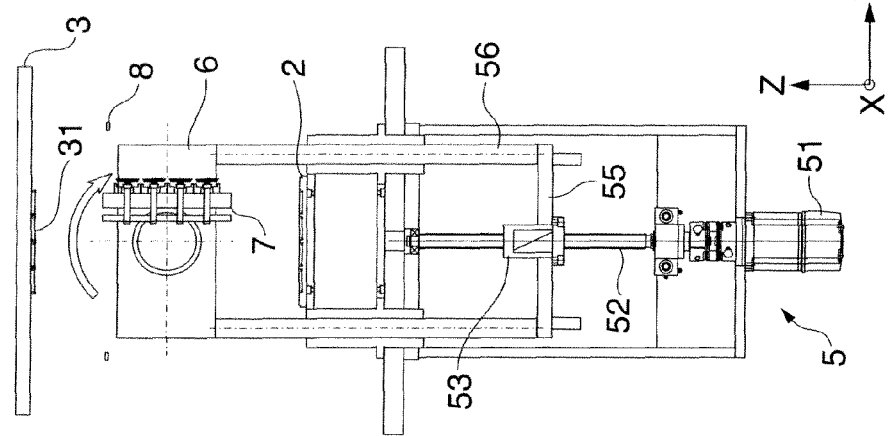
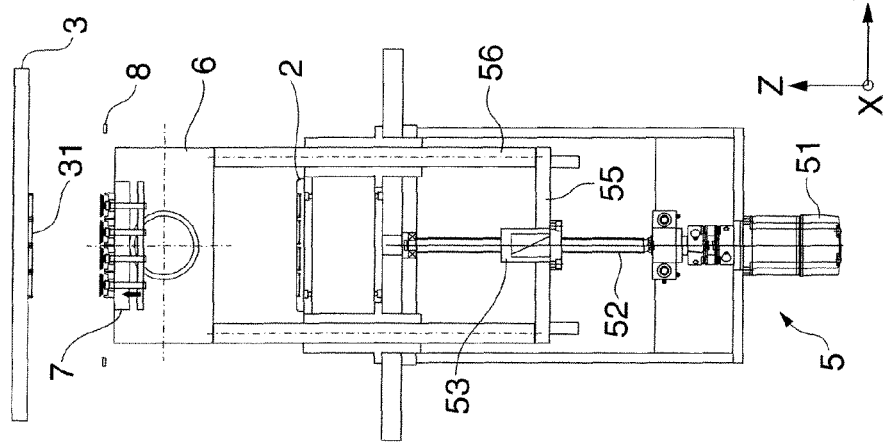

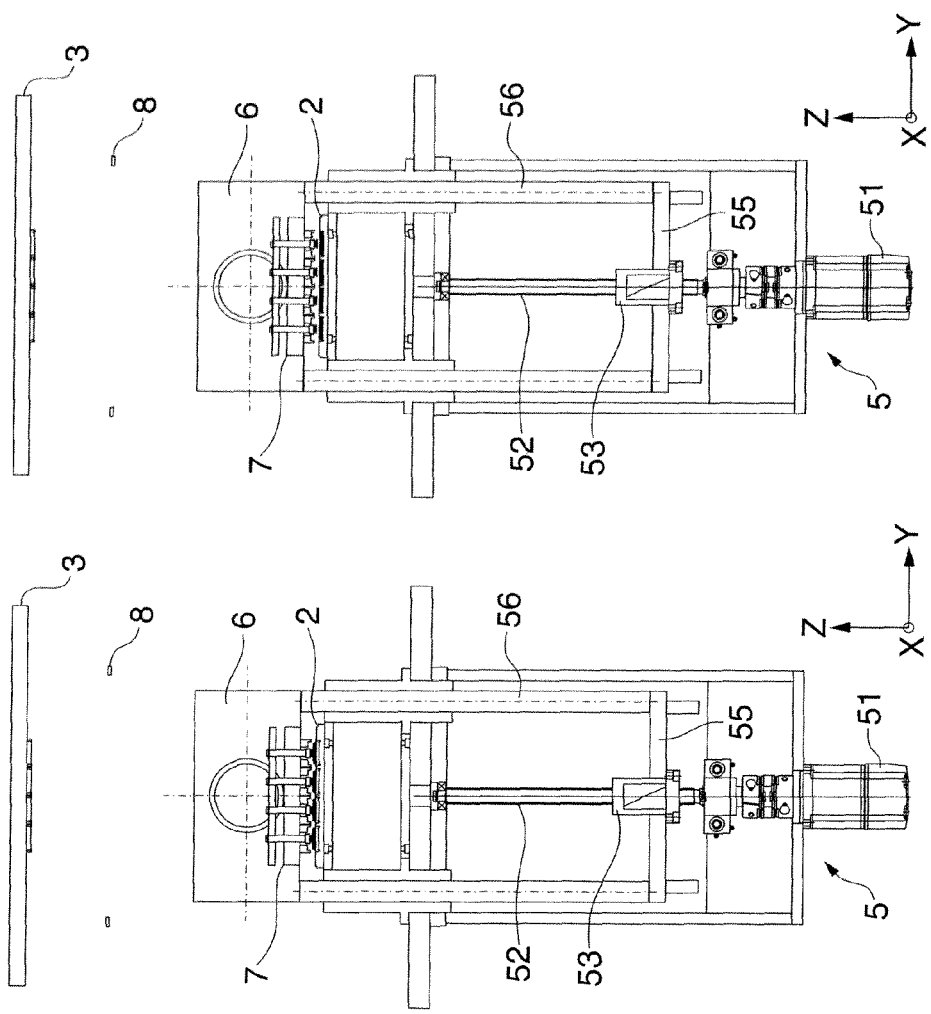

HANDLER

BACKGROUND OF THE INVENTION

The present invention relates to a handler which transports an electronic device.

Conventionally, a handler is used to handle an electronic device when inspecting an electronic device such as a semiconductor device or writing data in it.

The handler chucks an electronic device from an IC tray on which electronic devices are arrayed and mounted, and transports the electronic device to a tester or writer to inspect it or write data in it. To increase the efficiency of the handler, there has been developed a technique of executing inspection or data write at once for a plurality of electronic devices arrayed and mounted on the IC tray (see Japanese Patent Laid-Open No. 2007-309787).

This technique uses a test tray on which a plurality of holes each for receiving an electronic device package, and pads wired in accordance with the dimensions of the terminals of respective electronic devices are formed in conformity to a plurality of electronic devices arrayed on the IC tray. A test or data write is executed at once for a plurality of electronic devices transferred to the test tray. More specifically, the test tray is aligned with the IC tray bearing a plurality of electronic devices. In this state, the test tray and IC tray are turned over to transfer the electronic devices onto the test tray. Instead of the IC tray, a substrate (socket) having pads conforming to the dimensions of the lead terminals of the electronic devices is superposed on the test tray. The test tray and substrate are clamped and pressed by a press jig via a rubber, bringing the lead terminals of the electronic devices, the pads of the test tray, and the pads of the substrate into contact with each other. In this state, the signal input/output connector of the substrate is connected to the writer or tester to connect the lead terminals of a plurality of electronic devices mounted on the test tray to the writer or tester at once.

However, in the conventional technique, when transferring electronic devices from the IC tray to the test tray, an error may occur, failing to accurately arrange them on the test tray. The press jig presses the electronic devices in this state, generating a defective or a breakdown of the apparatus such that the lead terminal of the electronic device is bent or the test tray or socket is damaged. This is because electronic devices are transferred to the test tray by turning over the test tray and IC tray while superposing the test tray on the IC tray.

SUMMARY OF THE INVENTION

It is an object of the present invention to provide a handler capable of suppressing generation of a defective and the breakdown of the apparatus.

In order to achieve the above object, according to the present invention, there is provided a handler comprising a table which supports an electronic device, a socket which is arranged to face the table, and a transport mechanism which transports the electronic device, the transport mechanism including a contact head having a lead press with a recess for storing the electronic device, and a chuck sleeve which extends through the lead press, is arranged relatively movable from the lead press in a direction in which the chuck sleeve extends, and chucks the electronic device, an elevating mechanism which moves the contact head between the table and the socket, a pivot mechanism which pivots the contact head within a vertical plane, and a control unit which controls chucking and release of the electronic device by the chuck sleeve, and vertical movement and pivot of the contact head.

BRIEF DESCRIPTION OF THE DRAWINGS

FIGS. 6A to 6C are views for explaining the operation of the handler according to the embodiment of the present invention;

FIGS. 7A to 7C are views for explaining the operation of the handler according to the embodiment of the present invention;

FIGS. 9A to 9C are views for explaining the operation of the handler according to the embodiment of the present invention;

FIGS. 10A and 10B are views for explaining the operation of the handler according to the embodiment of the present invention.

DESCRIPTION OF THE PREFERRED EMBODIMENT

A preferred embodiment of the present invention will be described in detail below with reference to the accompanying drawings.

[Arrangement of Handler]

Figure 1:
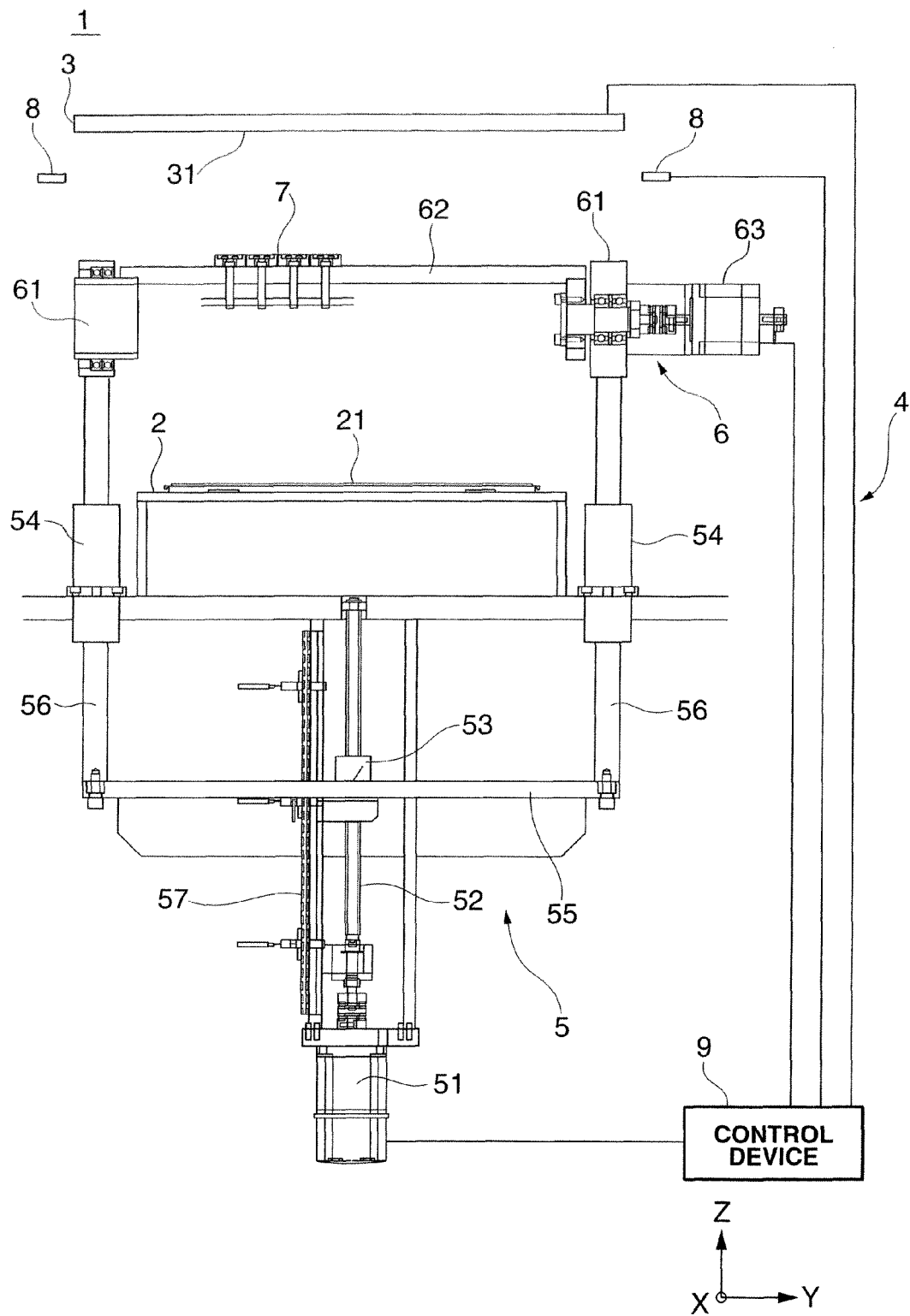
FIG. 1 is a front view showing the arrangement of a handler according to an embodiment of the present invention.
Figure 2:
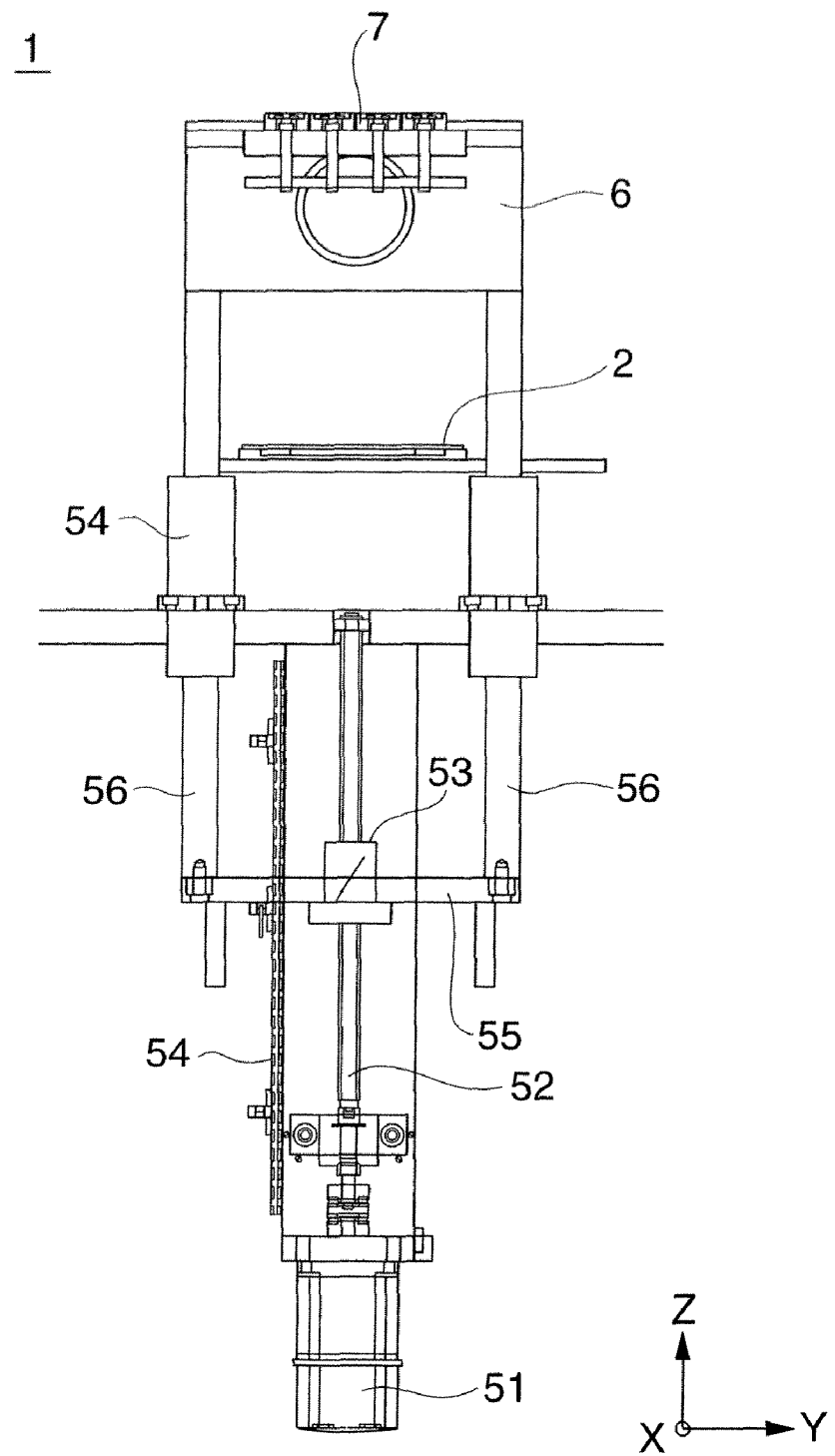
FIG. 2 is a side view showing the arrangement of the handler according to the embodiment of the present invention.

As shown in FIGS. 1 and 2, a handler 1 according to the embodiment includes a table 2 which supports an electronic device, a socket 3 arranged to face the table 2, and a transport mechanism 4 which transports an electronic device.

The table 2 has an upper surface 21 along the X-Y plane. An IC tray on which electronic devices are arrayed and mounted is placed on the upper surface 21. In the following description, the vertical direction is defined as the Z-axis, and directions perpendicular to the Z-axis are defined as the X- and Y-axes. A positive side along the Z-axis is defined as the upside in the vertical direction.

The socket 3 is arranged above the table 2 (positive side along the Z-axis) and faces down. Pads to be connected to the terminals of electronic devices are formed on a lower surface 31 facing the upper surface 21 of the table 2.

The transport mechanism 4 includes an elevating mechanism 5, pivot mechanism 6, contact head 7, sensor 8, and control device 9. The pivot mechanism 6 is supported movably in the Z direction by the elevating mechanism 5. The contact head 7 is supported pivotally about the X-axis by the pivot mechanism 6. The sensor 8 is interposed between the socket 3 and the transport mechanism 4. The control device 9 controls the overall operation of the transport mechanism 4.

The elevating mechanism 5 includes a Z-axis motor 51, a ball screw 52, a nut 53, guides 54, a beam 55, columns 56, and a position sensor 57. The Z-axis motor 51 is arranged below the table 2, has a pivot shaft along the Z-axis, and is formed from a known pulse motor. The ball screw 52 is connected to the pivot shaft of the Z-axis motor 51 and extends immediately below the table along the Z-axis. The nut 53 is attached to the ball screw 52. The guides 54 are arranged parallel to the ball screw 52. The beam 55 extends in a direction perpendicular to the Z-axis, is coupled to the nut 53 at almost the center, and supported movably along the Z-axis. The columns 56 extend along the Z-axis and have lower ends connected to the beam 55. The position sensor 57 confirms the Z position of the nut 53. The elevating mechanism 5 having this structure pivots the Z-axis motor 51 to convert the pivot into movement along the Z-axis by the nut 53 and guides 54, thereby moving the beam 55 and columns 56 along the Z-axis.

The pivot mechanism 6 includes a pair of bearings 61, a head support 62, and an X-axis motor 63. The bearings 61 are arranged at the upper ends of the columns 56 of the elevating mechanism 5. The head support 62 extends along the X-axis and have two ends connected to the bearings 61. The X-axis motor 63 is fixed to one bearing 61, connected to one end of the head support 62, and is formed from a known pulse motor. The pivot mechanism 6 having this structure drives the X-axis motor 63 to pivot the head support 62 about the X-axis, thereby pivoting the contact head 7 attached to the head support 62 about the X-axis.

The contact head 7 includes a base 71, a plurality of lead presses 72, and a plurality of chuck sleeves 73. The base 71 is fixed at almost the center of the head support 62. On a surface of the base 71 that is parallel to the X-axis, the lead presses 72 are arrayed at the same pitches as those on the IC tray. Each chuck sleeve 73 extends through a hole 722 (to be described later) which is formed at almost the center of the lead press 72.

Figure 3:
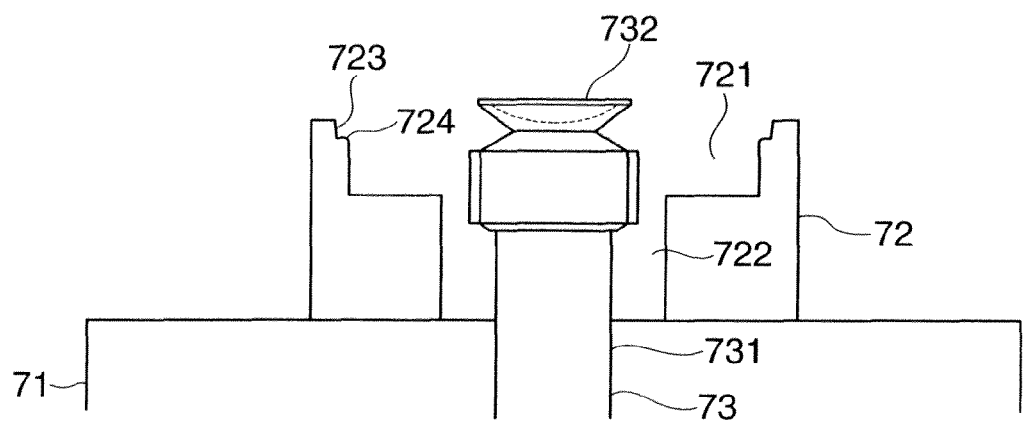
FIG. 3 is a view showing part of the contact head of the handler according to the embodiment of the present invention.

As shown in FIG. 3, each lead press 72 includes a recess 721, the hole 722, a tapered portion 723, and a terminal receiver 724. The recess 721 has an almost rectangular plane shape corresponding to the plane shape of an electronic device to be transported. The hole 722 is formed at almost the center of the bottom of the recess 721. The tapered portion 723 is tapered toward the bottom by obliquely cutting the upper end face of the recess 721 to a predetermined position toward the inner side surface. The terminal receiver 724 is formed from the end of the tapered portion 723 on the side of the inner side surface toward the inner side surface of the recess 721. The terminal receiver 724 has a flat surface almost parallel to the bottom of the recess 721.

Each chuck sleeve 73 includes a cylindrical sleeve 731 exposed from the recess 721, and a chuck end 732 formed at the distal end of the sleeve 731. The chuck sleeve 73 is supported so that it is movable by a driving mechanism (not shown) in a direction (direction in which the sleeve 731 extends) perpendicular to the base 71 of the contact head 7. The chuck sleeve 73 externally receives a negative pressure based on an instruction from the control device 9.

The sensor 8 is formed from at least a pair of beam sensors which are arranged at predetermined positions between the socket 3 and the transport mechanism 4 so as to sandwich the columns 56.

Figure 4:
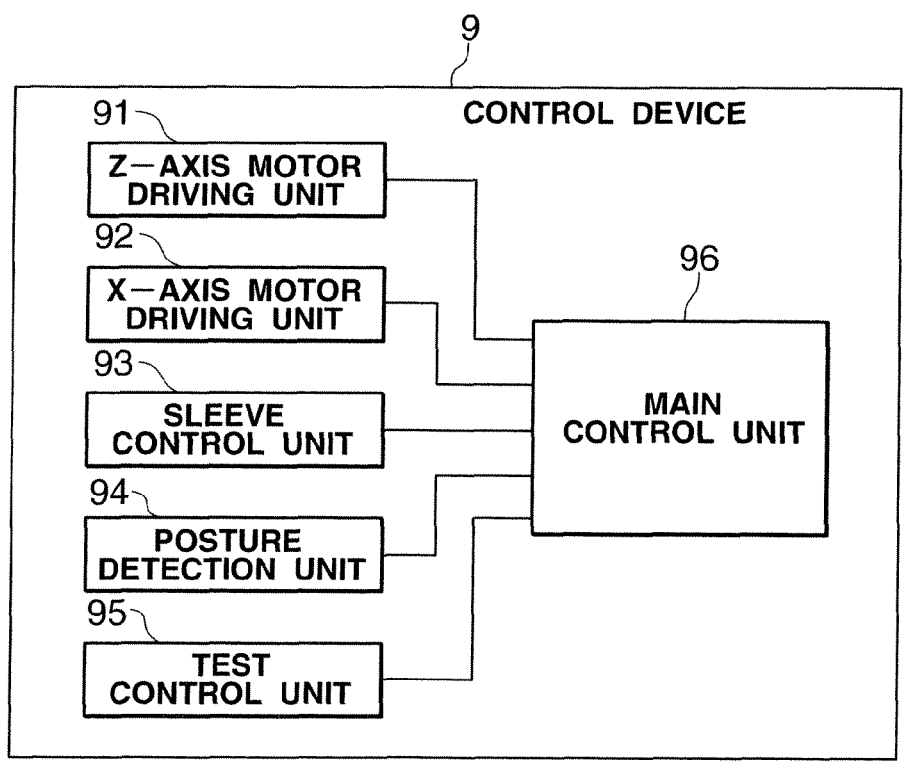
FIG. 4 is a block diagram schematically showing the arrangement of the control device of the handler according to the embodiment of the present invention.
Figure 5:
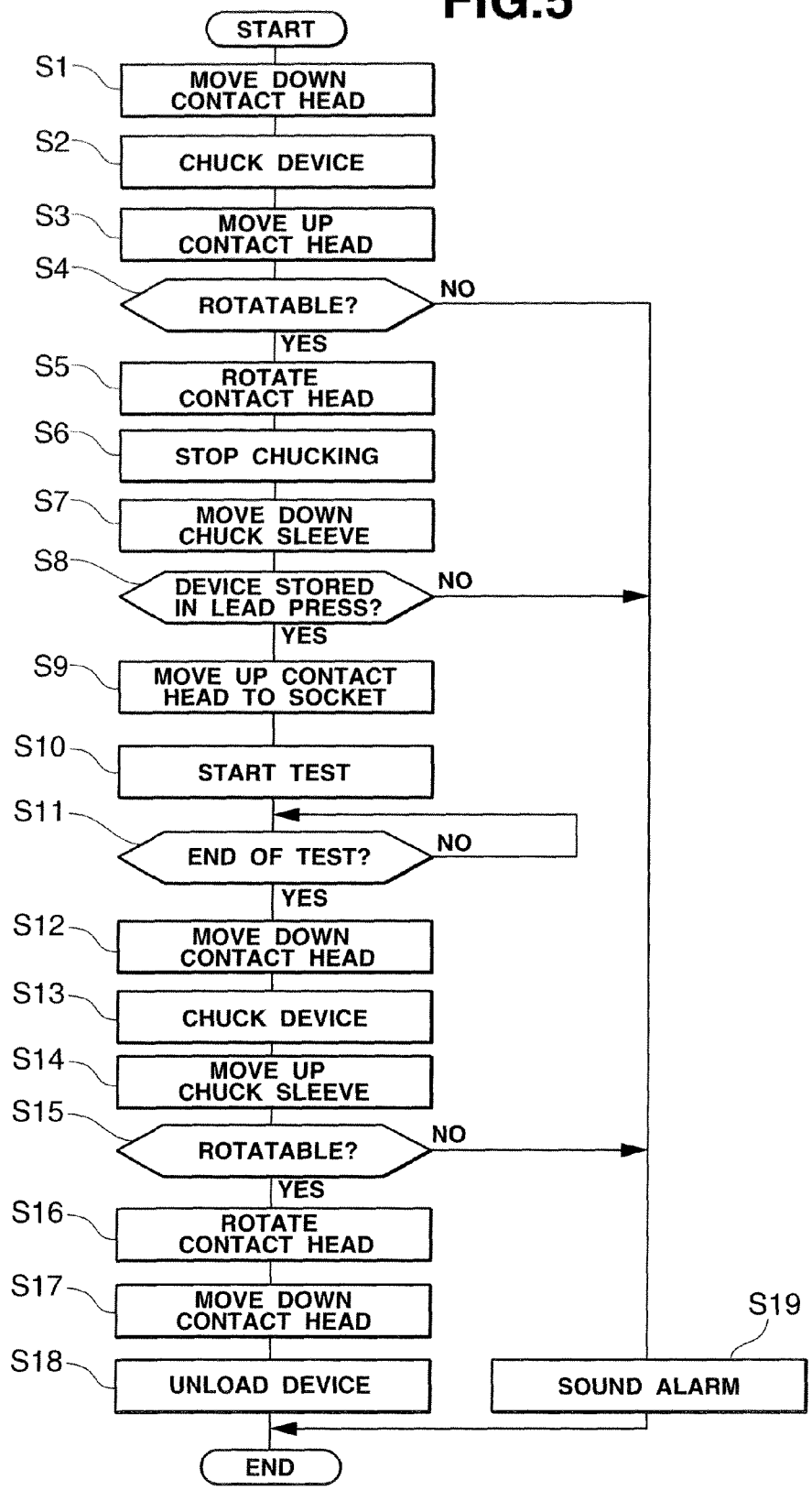
FIG. 5 is a flowchart showing the operation of the handler according to the embodiment of the present invention.

As shown in FIG. 4, the control device 9 includes a Z-axis motor driving unit 91, X-axis motor driving unit 92, sleeve control unit 93, posture detection unit 94, test control unit 95, and main control unit 96. The Z-axis motor driving unit 91 controls driving of the Z-axis motor 51 by outputting a driving signal to the Z-axis motor 51. The X-axis motor driving unit 92 controls driving of the X-axis motor 63 by outputting a driving signal to the X-axis motor 63. The sleeve control unit 93 controls movement of the chuck sleeve 73 in a direction in which the chuck sleeve 73 extends, and supply of a negative pressure. Based on the detection result of the sensor 8, the posture detection unit 94 detects the posture of an electronic device picked up by the contact head 7. The test control unit 95 controls inspection and data write of an electronic device that are executed by the socket 3. The main control unit 96 controls the operations of these functional units. The control device 9 is formed from a computer and a program installed in the computer. The computer comprises an arithmetic unit (e.g., a CPU), a storage device (e.g., a memory or HDD (Hard Disk Drive)), an input device which detects external input of information (e.g., a keyboard, mouse, pointing device, button, or touch panel), an I/F which transmits/receives various kinds of information via a communication line such as the Internet, LAN (Local Area Network), or WAN (Wide Area Network), and a display device (e.g., a CRT (Cathode Ray Tube), LCD (Liquid Crystal Display), FED (Field Emission Display), or organic EL (Electro Luminescence)). The hardware resources and software cooperate with each other to control the hardware resources by the program, implementing the above-described Z-axis motor driving unit 91, X-axis motor driving unit 92, sleeve control unit 93, posture detection unit 94, test control unit 95, and main control unit 96. Note that the program may be provided by recording it on a recording medium such as a flexible disk, CD-ROM, DVD-ROM, or memory card.

[Operation of Handler]

The operation of the handler 1 according to the embodiment will be explained with reference to FIGS. 5 to 11D.

The IC tray is placed on the upper surface 21 of the table 2. When performing inspection or data write for electronic devices arrayed and mounted on the IC tray, the main control unit 96 of the control device 9 controls the Z-axis motor driving unit 91 to drive the Z-axis motor 51 and move down the contact head 7 immediately above the table 2 while the chuck sleeves 73 face the table 2 (step S1, FIG. 6A). The chuck sleeves 73 of the contact head 7 are arrayed in one-to-one correspondence with electronic devices mounted on the IC tray in advance. When, therefore, the contact head 7 moves to a position immediately above the table 2, the electronic devices and chuck sleeves 73 face each other. At this time, the chuck sleeves 73 project in a direction in which they move apart from the lead presses 72, i.e., toward the table 2.

When the contact head 7 moves down, the main control unit 96 supplies a negative pressure to the chuck sleeves 73 in accordance with an instruction from the sleeve control unit 93 (step S2, FIG. 6B). By the negative pressure, the electronic devices facing the chuck ends 732 of the chuck sleeves 73 are sucked toward the chuck sleeves 73 and chucked by the chuck ends 732.

After the electronic devices are chucked, the main control unit 96 controls the Z-axis motor driving unit 91 to drive the Z-axis motor 51 and move up the contact head 7 to a predetermined position near the sensor 8 (step S3, FIG. 6C).

After the contact head 7 moves up, the main control unit 96 confirms whether the contact head 7 can be rotated about the X-axis (step S4). This confirmation is made by, for example, checking by the position sensor 57 whether the contact head 7 is at a position where it does not interfere with another mechanism when the contact head 7 is pivoted.

If the contact head 7 cannot be rotated (NO in step S4), the main control unit 96 stops the operation of the handler 1 by sounding an alarm from a loudspeaker or the like, or displaying a warning on the display device (step S19).

If the contact head 7 can be rotated (YES in step S4), the main control unit 96 controls the X-axis motor driving unit 92 to drive the X-axis motor 63 and pivot the contact head 7 counterclockwise through 180° about the X-axis (step S5, FIG. 7A). Then, the chuck ends 732 of the chuck sleeves 73 face the socket 3. That is, the terminals of the electronic devices face pads formed on the lower surface 31 of the socket 3.

Figure 11A:
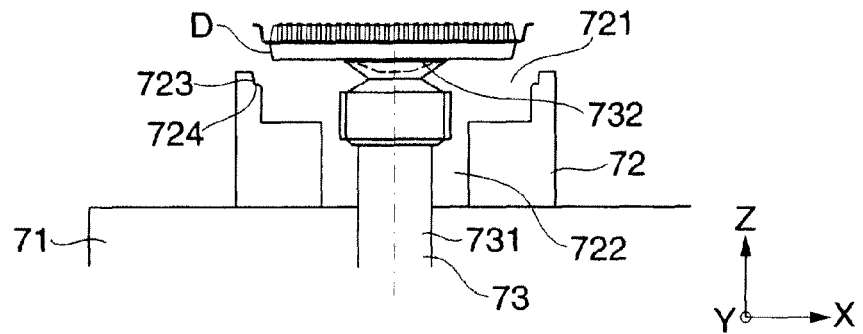
FIGS. 11A to 11D are views for explaining an operation of storing an electronic device in the lead press of the handler according to the embodiment of the present invention.

While the chuck ends 732 face the socket 3, the main control unit 96 controls the sleeve control unit 93 to stop the supply of the negative pressure to the chuck sleeves 73 (step S6, FIG. 7B). At this time, each electronic device is placed on the chuck end 732 of the chuck sleeve 73 and positioned above the recess 721, as shown in FIG. 11A.

Figure 11B:
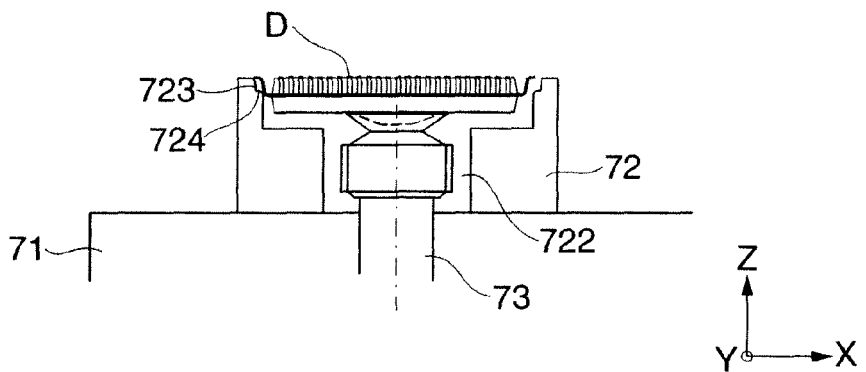
Figure 11C:
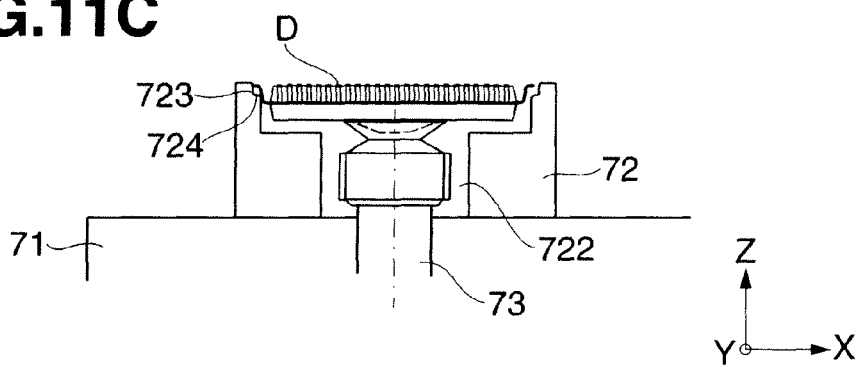
Figure 11D:
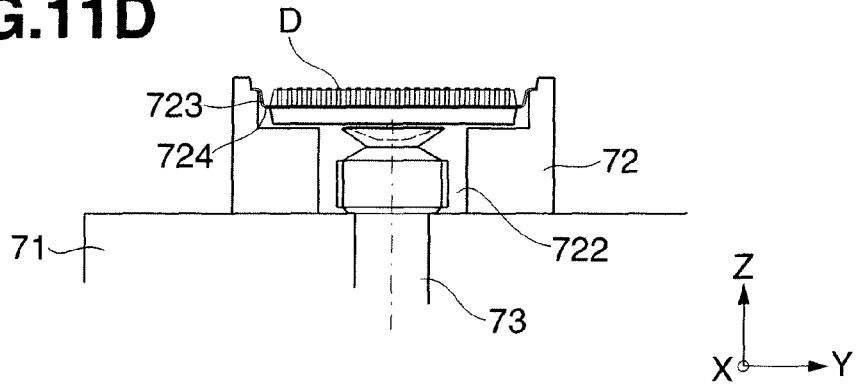

After the supply of the negative pressure stops, the main control unit 96 controls the sleeve control unit 93 to move down the chuck sleeves 73, i.e., move their ends into the recesses 721 of the lead presses 72 (step S7, FIG. 7C). That is, the main control unit 96 moves down each chuck sleeve 73 toward the base 71, as shown in FIGS. 11B to 11D. Along with the down movement, an electronic device D placed on the chuck end 732 of the chuck sleeve 73 moves down by gravity. The terminal of the electronic device D contacts the tapered portion 723 obliquely cut from the upper surface of the recess 721 toward the inner side surface and moves down along the inclination by gravity, as shown in FIGS. 11B and 11C. Accordingly, the terminal of the electronic device D smoothly, reliably reaches the terminal receiver 724, as shown in FIG. 11D.

Figure 8A:
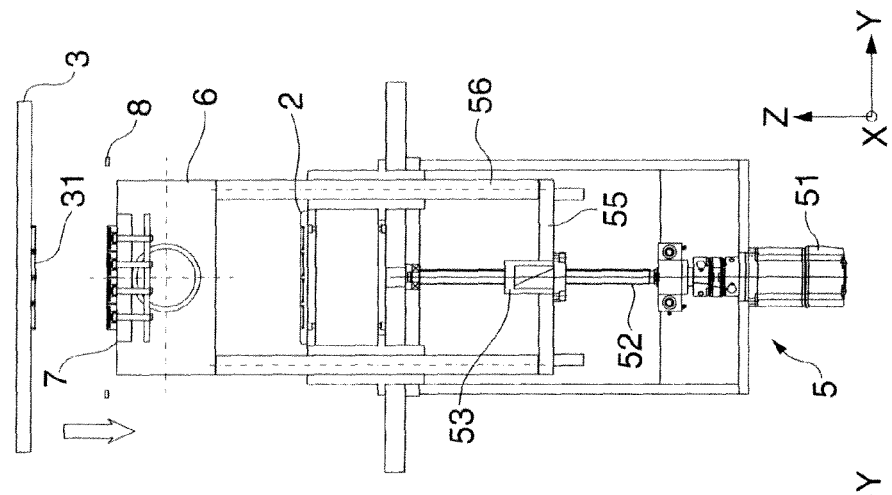
FIGS. 8A to 8C are views for explaining the operation of the handler according to the embodiment of the present invention.
Figure 8B:
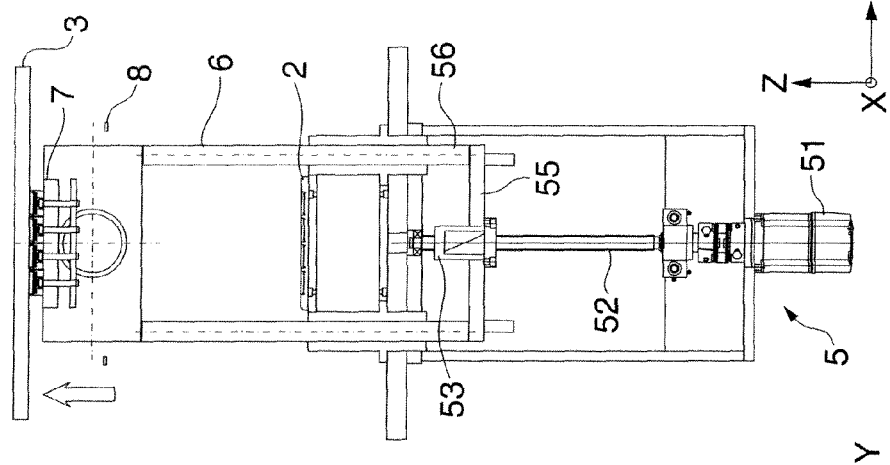

After the chuck sleeve 73 moves down, the main control unit 96 controls the posture detection unit 94 to confirm whether the electronic device is stored at a predetermined position in the lead press 72 (step S8, FIG. 8A). This confirmation is made by checking the presence/absence of the terminal of the electronic device by the sensor 8. In this operation, the sensor 8 is arranged at a position on the X-Y plane slightly above the terminal of the electronic device. If the sensor 8 detects the terminal of the electronic device, it is determined that the electronic device is not appropriately stored in the lead press 72.

If the electronic device is not stored at the predetermined position in the lead press 72 (NO in step S8), the main control unit 96 advances to the process of step S19.

If the electronic device is stored at the predetermined position in the lead press 72 (YES in step S8), the main control unit 96 controls the Z-axis motor driving unit 91 to drive the Z-axis motor 51 and move up the contact head 7 toward the socket 3. The contact head 7 is pressed against the socket 3 so that the terminals of the electronic devices stored in the lead presses 72 of the contact head 7 contact the pads formed on the lower surface 31 of the socket 3 (step S9, FIG. 8B). At this time, the electronic devices are accurately stored in the recesses 721 of the lead presses 72. Thus, even if the electronic devices are pressed against the pads of the socket 3, neither a defective nor a breakdown is generated.

After the terminals of the electronic devices contact the pads of the socket 3, the main control unit 96 controls the test control unit 95 to start a test or data write for the electronic devices via the socket 3 (step S10).

Figure 8C:
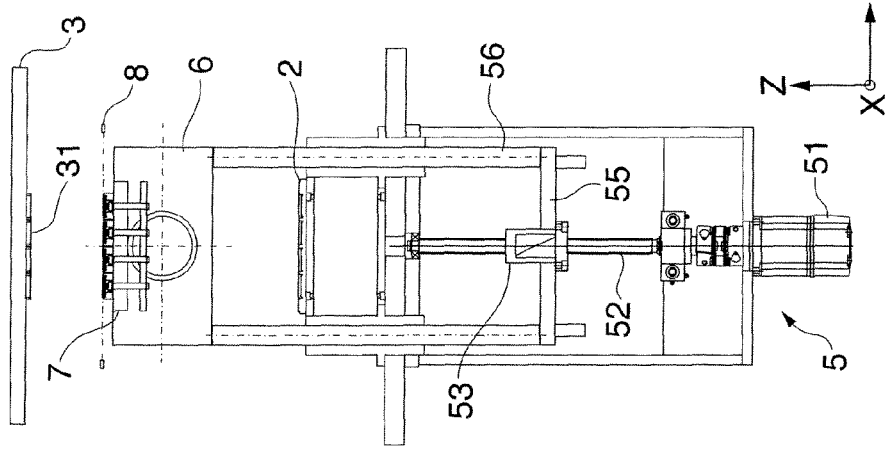

After the end of the test or the like (YES in step S11), the main control unit 96 controls the Z-axis motor driving unit 91 to drive the Z-axis motor 51 and move down the contact head 7 to a predetermined position (step S12, FIG. 8C). The predetermined position may be identical to the position to which the contact head 7 moved up in step S3.

After the contact head 7 moves down, the main control unit 96 controls the sleeve control unit 93 to supply a negative pressure to the chuck sleeves 73 (step S13). Then, the chuck sleeves 73 chuck and fix the electronic devices placed on the chuck ends 732 of the chuck sleeves 73 of the contact head 7.

After the electronic devices are chucked, the main control unit 96 controls the sleeve control unit 93 to move up the chuck sleeves 73, i.e., project them in a direction in which they move apart from the lead presses (step S14, FIG. 9A).

After the chuck sleeves 73 move up, the main control unit 96 confirms whether the contact head 7 can be rotated about the X-axis (step S15). As described above, this confirmation is made by, for example, checking by the position sensor 57 whether the contact head 7 is at a position where it does not interfere with another mechanism when the contact head 7 is pivoted.

If the contact head 7 cannot be rotated (NO in step S15), the main control unit 96 advances to the process of step S19.

If the contact head 7 can be rotated (YES in step S15), the main control unit 96 controls the X-axis motor driving unit 92 to drive the X-axis motor 63 and pivot the contact head 7 clockwise through 180° about the X-axis (step S16, FIG. 9B). Then, the chuck ends 732 of the chuck sleeves 73 face the table 2.

After the contact head 7 is pivoted, the main control unit 96 controls the Z-axis motor driving unit 91 to drive the Z-axis motor 51 and move down the contact head 7 to a position immediately above the table 2 (step S17, FIG. 9C). The electronic devices are brought close to the IC tray placed on the upper surface 21 of the table 2 (FIG. 10A).

After the contact head 7 moves down, the main control unit 96 controls the sleeve control unit 93 to stop the supply of the negative pressure to the chuck sleeves 73 (step S18, FIG. 10B). Accordingly, the electronic devices chucked by the chuck ends 732 of the chuck sleeves 73 are released from the chuck ends 732 and placed at predetermined positions on the IC tray.

In this manner, according to the embodiment, while the openings of the recesses 721 of the lead presses 72 face the table 2, the chuck sleeves 73 chuck electronic devices. Then, the contact head 7 is turned over to face the socket 3, i.e., make the lead presses 72 face up. In this state, chucking by the chuck sleeves 73 is canceled. By moving down the chuck sleeves 73, the electronic devices move down by gravity and are accurately stored in the recesses 721 of the lead presses 72. In this state, the contact head 7 is pressed against the socket 3. Generation of a defective and a breakdown can therefore be suppressed.

According to the embodiment, a plurality of lead presses are arranged, so a test or the like can be done simultaneously for a plurality of electronic devices, increasing the work efficiency.

The present invention is applicable to various kinds of apparatuses which transport electronic components, such as a handler and surface mounting device.

According to the present invention, while the openings of the recesses of the lead presses face the table, the chuck sleeves chuck electronic devices. Then, the contact head is turned over to face the socket, i.e., make the lead presses face up. In this state, chucking by the chuck sleeves is canceled. By moving down the chuck sleeves, the electronic devices move down by gravity and are accurately stored in the recesses of the lead presses. In this state, the contact head is pressed against the socket. Generation of a defective and a breakdown can therefore be suppressed.

What is claimed is:

1. A handler comprising:
a table which supports an electronic device;
a socket which is arranged to face said table; and a transport mechanism which transports the electronic device, said transport mechanism including a contact head having a lead press with a recess for storing the electronic device, and a chuck sleeve which extends through the lead press, is arranged relatively movable from the lead press in a direction in which the chuck sleeve extends, and chucks the electronic device, an elevating mechanism which moves said contact head between said table and said socket, a pivot mechanism which pivots said contact head within a vertical plane, and a control unit which controls chucking and release of the electronic device by the chuck sleeve, and vertical movement and pivot of said contact head.

2. A handler according to claim 1, wherein an inner side surface of the recess of the lead press has a tapered portion which is tapered toward a bottom of the recess.

3. A handler according to claim 1, wherein the lead press includes a plurality of lead presses, and the chuck sleeve includes a plurality of chuck sleeves.

4. A method for controlling a handler including a table which supports an electronic device, a socket which is arranged to face said table, and a transport mechanism which transports the electronic device, said transport mechanism including a contact head having a lead press with a recess for storing the electronic device, and a chuck sleeve which extends through the lead press, an elevating mechanism which moves said contact head between said table and said socket, said method comprising:

controlling the chuck sleeve to chuck the electronic device while said contact head faces said table, moving up and pivoting said contact head to make an end of the chuck sleeve that chucks the electronic device face up vertically, then stops chucking, vertically moving the chuck sleeve down to store the electronic device in the recess of the lead press, and controlling said elevating mechanism to move said contact head up to said socket arranged above said table and bring a terminal of the electronic device into contact with said socket.

* * * * *